United States Patent [19]

Ohno

[11] 4,143,508
[45] Mar. 13, 1979

[54] ELECTRONIC CIRCUIT BLOCK

[75] Inventor: Hideshi Ohno, Sayama, Japan

[73] Assignee: Citizen Watch Co. Ltd., Tokyo, Japan

[21] Appl. No.: 696,487

[22] Filed: Jun. 16, 1976

[30] Foreign Application Priority Data

Jun. 19, 1975 [JP] Japan .................................. 50-74786

[51] Int. Cl.² .............................................. G04C 3/00
[52] U.S. Cl. ............................... 58/23 R; 174/52 PE;
174/52 FP; 357/70; 357/72; 357/75; 361/401;
361/402
[58] Field of Search ......................... 29/177; 58/23 R;
174/52 R, 52 FP, 52 PE; 317/101 A, 101 CP,
101 DH; 357/65, 70, 72, 75, 49; 361/401, 402

[56] References Cited

U.S. PATENT DOCUMENTS

| 3,568,012 | 3/1971 | Ernst et al. | 357/49 X |
| 3,579,056 | 5/1971 | Te Velde et al. | 357/49 |
| 3,759,031 | 9/1973 | McCullough et al. | 58/23 R X |
| 3,784,725 | 1/1974 | Perkins et al. | 174/52 R |
| 3,986,334 | 10/1976 | Harper | 58/23 R X |
| 4,015,422 | 4/1977 | Van Haaften | 58/23 R |

Primary Examiner—Stanley J. Witkowski
Attorney, Agent, or Firm—Sherman & Shalloway

[57] ABSTRACT

An electronic circuit block for use in a timepiece comprising a circuit substrate with component-receiving portions, circuit components mounted on the component-receiving portions with terminals at the same level with the upper surfaces of the circuit components, an insulated layer made of polyimide resins formed on at least a part of the circuit substrate and in gaps between the components and the component-receiving portions and a conductive pattern formed on the insulated layer after a part of the insulated layer is excluded whereby connections of components are made by said conductive pattern.

3 Claims, 8 Drawing Figures

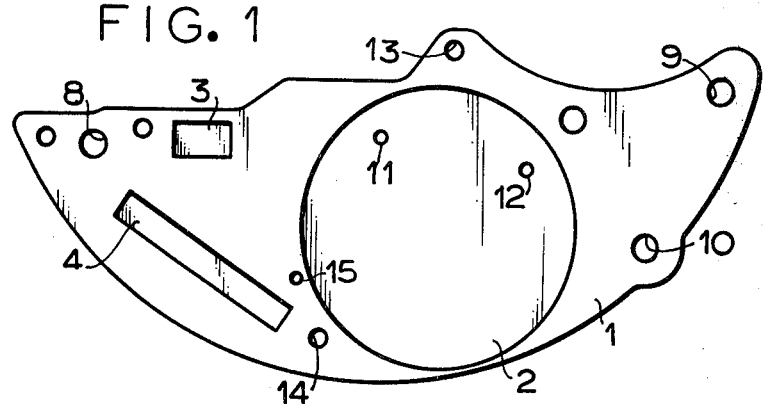
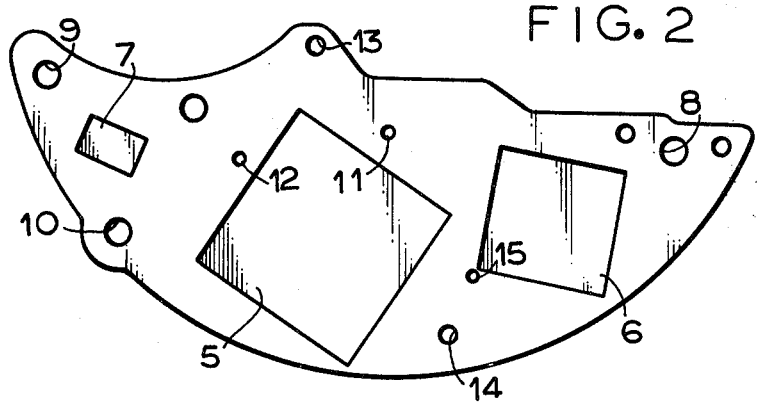
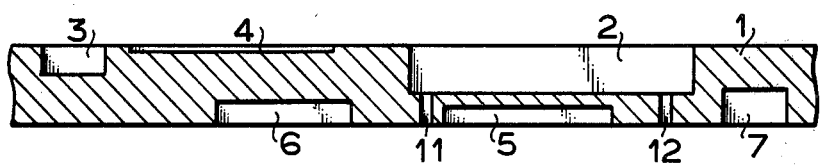
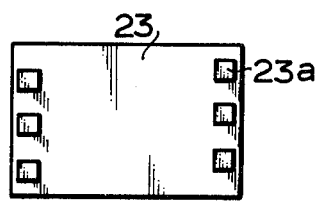
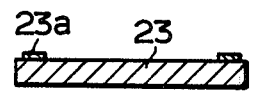

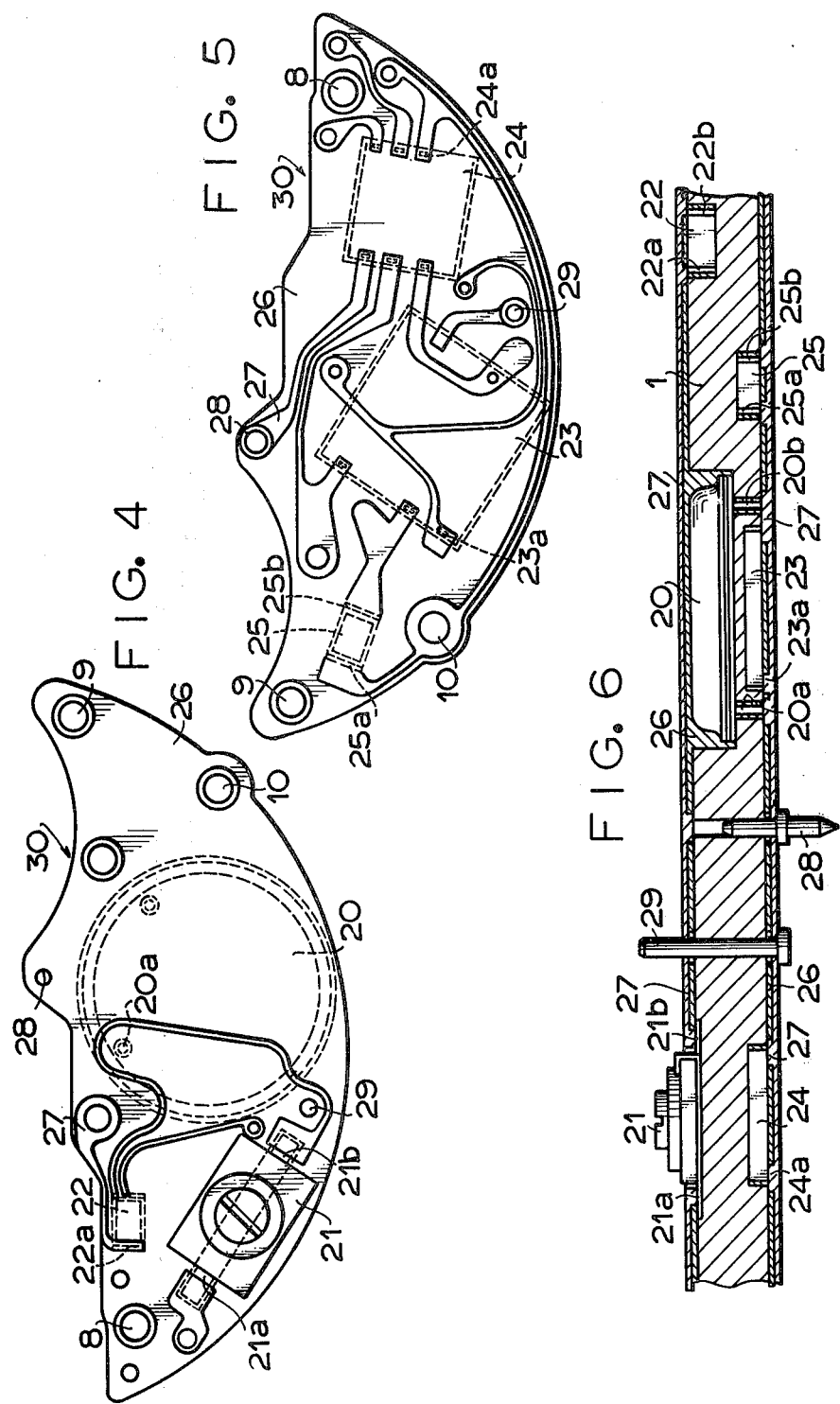

ELECTRONIC CIRCUIT BLOCK

BACKGROUND OF THE INVENTION

This invention relates to an electronic circuit block, especially to an improved electronic circuit block comprising part-receiving portions on the circuit substrate on which an integrated circuit, condenser, crystal oscillating element and the like are mounted with the upper surfaces of the respective connecting parts or terminal elements being substantially on the same level with each other. Further, an insulating layer made of polyimide resins is formed on the circuit substrate, with gaps between the parts and the part receiving portions being filled with the resins and a conductive pattern is formed on the insulated layer, whereby each of the parts or elements are connected.

DESCRIPTION OF THE PRIOR ART

Heretofore, electronic circuit blocks for use in a timepiece that have used copper foil bonded to both surfaces of a base plate made of glass mixed epoxy resins and then the copper foil is etched, so that the desired pattern is made or through holes are made by a punching method and the base is plated so that a circuit substrate is manufactured, and components, e.g. an integrated circuit, condenser, crystal oscillator are fixed by soldering on the predetermined wiring pattern of the circuit substrate.

However, these conventional circuit blocks have a disadvantage in that it is very troublesome to solder the components such as the integrated circuit, condenser, crystal and oscillator on the wiring pattern of the circuit substrate and, further, that a soldered portion happens to cause the disturbance in conductivity since the soldered portion is liable to break off. Therefore, the reliability of a prior electric circuit block depends on the soldering work.

In soldering in itself, there is a limitation in the width of the wiring patten and its pitch in view of the workability. This is particularly important in a device where many functions are required to be inserted into limited spaces, such as in a timepiece.

OBJECT OF THE INVENTION

An object of this invention is to obviate the above disadvantages and to provide an improved electronic circuit block.

Another object of this invention is to obviate the work of soldering circuit elements on a circuit substrate, thereby providing an electronic circuit block which is reliable and highly compact and able to be manufactured in mass production.

These and further objects, features and advantages of the invention will become more apparent when read in conjunction with the following detailed description of the invention by way of example of several preferred embodiments thereof with reference to the accompanying drawings.

BRIEF DESCRIPTION OF THE DRAWINGS

FIG. 1 is a plan view of the circuit substrate according to this invention;

FIG. 2 is a back view of the circuit substrate of FIG. 1;

FIG. 3 is a side view of FIG. 1;

FIG. 4 is a plan view showing a completed electronic circuit block provided with components;

FIG. 5 is a back view of the electronic circuit of FIG. 4;

FIG. 6 is a sectional view of the electronic circuit of FIG. 4;

FIG. 7 is a plan view showing an integrated circuit chip on which bumps are formed for use in a timepiece according to this inention; and FIG. 8 is a sectonal view of FIG. 7.

DETAILED DESCRIPTION OF PREFERRED EMBODIMENTS

In FIGS. 1 through 3, reference numeral 1 depicts a circuit substrate made of resin which is manufactured by a method superior in mass production like injection molding, etc. On the upper surface or side of the circuit substrate, a crystal oscillator-receiving portion 2, input condenser-receiving portion 3 and trimmer condenser-receiving portion 4 are provided as recesses therein. On the lower side of the circuit substrate, the first integrated circuit receiving portion 5, the second integrated circuit receiving portion 6 and output side condenser receiving portion 7 are provided as recesses. In addition, the circuit substrate has holes 8, 9, 10 to attach the circuit substrate to a base plate (not shown); holes 11, 12 to receive the terminals of the crystal oscillator; holes 13, 14 to receive the other terminals; and a through hole 15 and the like. The depth of each component-receiving portion is designed such that the upper surfaces of the electrode portions or lead terminal are located in a plane meeting that of the connection surfaces of the circuit substrate when the components are mounted in the component receiving portions. At this time, the conductive pattern is not formed on the circuit substrate.

As shown in FIG. 4 through 6, the electronic circuit blocks are completed by attaching components, e.g., the integrated circuit, condenser and crystal oscillator.

In the drawing, reference numeral 20 depicts a crystal oscillator which is arranged on the crystal oscillator-receiving portion 2 of the circuit substrate 1 and the terminals 20a, 20b of the crystal oscillator are inserted into the holes 11, 12 of the circuit substrate so as to be fixed by a bonding agent. At this time, the ends of the terminals 20a, 20b of the crystal oscillator are in a plane meeting the rear connecting surfaces or side of the circuit substrate.

Reference numeral 21 is a trimmer condenser for adjusting the frequency of the crystal oscillator 20 and positioned in the trimmer condenser-receiving portion 4 by fixing it with a bonding agent. At this time, the upper surfaces of the terminals or lead portions 21a, 21b of the trimmer condenser are in plane meeting that of the connecting surface of the circuit substrate. Reference numeral 22 designates an input-side condenser which is arranged at the input-side condenser-receiving portion 3 and fixed by a bonding agent. At this time, the upper surfaces of the terminals or electrode portions 22a, 22b of the condenser 22 are in plane meeting that of the upper connecting surface of the circuit substrate 1.

As shown in FIG. 7 and 8, reference numeral 23 designates the first integrated chip in which terminals or bumps 23a for external terminal connection are formed on aluminum wirings. The integrated circuit chip 23 is positioned at the integrated circuit receiving portion 5 on the circuit substrate and fixed by a bonding agent. At this time, the upper surface of the terminal bump 23a on the first integrated circuit chip 23 is on the same level with the surface of the circuit substrate 1.

FIGS. 7 and 8 show an integrated circuit chip on which bumps are formed wherein FIG. 7 is a plan view and FIG. 8 is a sectional view. Reference numeral 23a depicts an extrusion of "bump" which is formed on an electrode pad for the external connection of the integrated circuit chip (23) by vapor deposition and plating.

Reference numeral 24 depicts the second integrated circuit chip, the shape of which are equivalent to that of the first integrated circuit chip 23. The second integrated circuit chip 24 is provided with bumps 24a for external terminal connections like the first integrated circuit chip 23. The second integrated circuit chip 24 is positioned in the integrated circuit receiving portion 6 on the circuit substrate 1 and fixed by a bonding agent such that the upper surfaces of bumps 24a on the second integrated circuit chip are on the same level with that of the circuit substrate 1.

Reference numeral 25 designates an output-side condenser which is positioned in the output side condenser receiving portion 7 on the circuit substrate and fixed by a bonding agent such that the upper surfaces of the electrode portions 25a, 25b of the output side condenser 25 are on the same level with the front surface of the circuit substrate.

As mentioned above, after the components such as the crystal oscillator 20, trimmer condenser 21, etc. are fixed to the component receiving portions on the circuit substrate 1, an insulated layer is formed over the whole surface on the circuit substrate 1 by polyimide resin and and within the gaps between the components, e.g., crystal oscillator, etc. and the respective component-receiving portions on the circuit substrate 1 with a polyimide resin. The insulated layer 26 is formed by the method that polyamic acid solution is painted on the whole surface of the circuit substrate 1 and the painted polyamic acid is then changed to polyimide by heat treatment. Thereafter, etching is effected on the insulated layer 26 at locations corresponding to the bump portion on the integrated circuit chips 23, 24 so that selected portions of the insulated layer 26 are excluded and as a result, the terminals, including the electrode portion, leading portion and bump portion, are exposed. Further, the conductive pattern 27 is then formed on the insulated layer 26, and the electrode portion, lead portion and bump portion beforehand exposed are thus connected with each other simultaneously.

The conductive pattern 27 may be produced by vacuum vapor deposition with a mask corresponding to the given pattern.

As mentioned above, an electronic circuit block 30 is completed by attaching necessary terminals, e.g., reset terminal 28 and measured terminal 29, etc. to the components, thereby to complete the connection between each other.

In the above embodiment, use is made of a circuit substrate made of resin by injection molding. However, a metal circuit substrate may be used if the connections between respective components are restricted to the conductive pattern and after the insulated layer is formed on the whole surface of the circuit substrate by heatproof high molecular resin, e.g., polyimide resins.

Furthermore, in the above embodiments, a single-layer wiring structure is described in which the connection is made by the conductive pattern 27 after the insulated layer 26 is formed. However, this invention also provides a multiple layer wiring structure in which insulated and conductive layers are superimposed alternatively and continuously.

As described above, according to this invention, circuit components such as an integrated circuit, condenser, crystal oscillator and the like are mounted on a circuit substrate having component-receiving portions such that the upper surfaces of electrode portions or leading portions are on the same plane as the upper surface of the circuit substrate. Then an insulated layer made of polyimide resins is formed on the circuit substrate; the gaps between the respective components and component-receiving portions of the circuit substrate are filled with the resin; selected portions of the insulated layer are removed; conductive patterns are formed, and then the components are connected with each other. Therefore, the connections between the components can be made simultaneously and the assembly period may be greatly shortened.

In addition, since the integrated circuit is deposited on the circuit substrate in chip shape, and the bumps on the integrated circuit and the electrodes are connected through the conductive patterns, the largest problem in manufacturing an integrated circuit, e.g., packaging, and particularly wire bonding is not necessary, the fitting of the integrated circuit can be effected simultaneously and as the result, mass productivity and reliability can be much improved.

Furthermore, since the circuit substrate may be applied by a production method such as an injection molding method which is excellent in mass productivity, an electronic circuit block low in cost can be produced and, as a result, this invention provides a great effect in practice.

What is claimed is:

1. An electronic circuit block for use in a timepiece and for mounting circuit components having terminals such as integrated circuits, and condensers having terminals for connection in a circuit, said circuit block comprising:
   (a) a substrate having
   (b) upper and lower connection surfaces for providing electrical connections to said circuit components,
   (c) a component-receiving recess in said upper connection surface for mounting at least one circuit component in said substrate with the terminals thereof positioned on the plane of said upper connection surface,
   (d) an insulating layer of polyimide resin having upper and lower surfaces, said insulating layer formed on said upper connection surface of said substrate and between and over said component and said recess, the lower surface being adjacent said upper connection surface,
   (e) said insulating layer having excluded areas adjacent said terminals, said terminals passing through the excluded areas of said insulating layer, and
   (f) a conductive pattern formed on the upper surface of said insulated layer and in direct contact with said terminals.

2. An electronic circuit block as set forth in claim 1 including a recess in said lower connection surface, an insulated layer on said lower connection surface, and a conductive pattern on said insulated layer on said lower connection surface.

3. An electronic circuit block as set forth in claim 2 in which said components include an integrated circuit chip and bump terminals provide direct contact between said chip and one of said conductive patterns.

* * * * *